(12) United States Patent
Haberecht

(10) Patent No.: US 8,709,156 B2
(45) Date of Patent: *Apr. 29, 2014

(54) METHODS FOR PRODUCING EPITAXIALLY COATED SILICON WAFERS

(75) Inventor: Joerg Haberecht, Freiberg (DE)

(73) Assignee: Siltronic AG, Munich (DE)

( * ) Notice: Subject to any disclaimer, the term of this patent is extended or adjusted under 35 U.S.C. 154(b) by 1041 days.

This patent is subject to a terminal disclaimer.

(21) Appl. No.: 12/765,899

(22) Filed: Apr. 23, 2010

(65) Prior Publication Data

US 2010/0294197 A1 Nov. 25, 2010

(30) Foreign Application Priority Data

May 20, 2009 (DE) .......................... 10 2009 022 224

(51) Int. Cl.
 *C30B 21/02* (2006.01)
(52) U.S. Cl.
 USPC ................. 117/84; 117/88; 117/90; 117/100; 117/104
(58) Field of Classification Search
 USPC ............................... 117/84, 88, 90, 100, 104
 See application file for complete search history.

(56) References Cited

U.S. PATENT DOCUMENTS

| 4,874,464 | A | 10/1989 | Goodwin et al. | |
| 6,630,024 | B2 | 10/2003 | Schmolke et al. | |
| 6,899,762 | B2 | 5/2005 | Wenski et al. | |
| 8,268,708 | B2 * | 9/2012 | Haberecht et al. | ............ 438/504 |
| 8,304,860 | B2 * | 11/2012 | Passek et al. | ................. 257/618 |
| 2007/0010033 | A1 | 1/2007 | Aderhold et al. | |
| 2007/0062438 | A1 * | 3/2007 | Schauer et al. | ................. 117/89 |
| 2007/0066036 | A1 | 3/2007 | Schauer et al. | |
| 2007/0066082 | A1 * | 3/2007 | Schauer et al. | ............... 438/758 |
| 2008/0182397 | A1 | 7/2008 | Lam et al. | |
| 2008/0245767 | A1 | 10/2008 | Kim et al. | |
| 2009/0261456 | A1 * | 10/2009 | Schauer et al. | ............... 257/618 |
| 2010/0213168 | A1 | 8/2010 | Haberecht | |

FOREIGN PATENT DOCUMENTS

| DE | 19938340 C1 | 2/2001 |
| DE | 10025871 A1 | 12/2001 |
| DE | 102005045337 A1 | 4/2007 |
| DE | 102005045338 A1 | 4/2007 |
| DE | 102005045339 A1 | 4/2007 |
| DE | 10 2009 010 556 A1 | 9/2010 |
| EP | 0445596 B1 | 5/1996 |

(Continued)

*Primary Examiner* — Bob M Kunemund
(74) *Attorney, Agent, or Firm* — Brooks Kushman P.C.

(57) ABSTRACT

Epitaxially coated silicon wafers are produced by placing a wafer polished on its front side on a susceptor in an epitaxy reactor, first pretreating under a hydrogen atmosphere and in a second and a third step with addition of an etching medium to the hydrogen atmosphere, and subsequently providing an epitaxial layer, wherein during the first and second steps the hydrogen flow rate is 20-100 slm, during the second and third steps the flow rate of the etching medium is 0.5-1.5 slm, during the second step the average temperature in the reactor chamber is 950-1050° C., and the power of heating elements above and below the susceptor is regulated such that there is a temperature difference of 5-30° C. between a radially symmetrical region encompassing the central axis of and a part lying outside this region; and during the third step the hydrogen flow rate is reduced to 0.5-10 slm. In a second method, during the third pretreatment step the flow rate of the etching medium is increased to 1.5-5 slm, while the hydrogen flow rate does not have to be reduced.

21 Claims, 3 Drawing Sheets

(56) References Cited

FOREIGN PATENT DOCUMENTS

| JP | 01-301589 | 5/1989 |
| JP | 2004363510 A | 12/2004 |
| JP | 2007005433 A | 1/2007 |

* cited by examiner

METHODS FOR PRODUCING EPITAXIALLY COATED SILICON WAFERS

CROSS-REFERENCE TO RELATED APPLICATION

This application claims priority to German Patent Application No. DE 10 2009 022 224.3 filed May 20, 2009 which is herein incorporated by reference.

BACKGROUND OF THE INVENTION

1. Field of the Invention

The invention relates to methods for producing epitaxially coated silicon wafers.

2. Background Art

Epitaxially coated silicon wafers are suitable for use in the semiconductor industry, in particular for the fabrication of large scale integrated electronic components such as microprocessors or memory chips. Starting materials (substrates) with stringent requirements for global and local flatness, thickness distribution, single-side-referenced local flatness (nanotopology) and freedom from defects are required for modern microelectronics.

Global flatness relates to the entire surface of a semiconductor wafer minus an edge exclusion to be defined. It is described by the GBIR ("global backsurface-referenced ideal plane/range," or magnitude of the positive and negative deviation from a backside-referenced ideal plane for the entire front side of the semiconductor wafer), which corresponds to the TTV ("total thickness variation") specification that was formerly customary.

The LTV ("local thickness variation") specification that was formerly customary is nowadays designated according to the SEMI standard by SBIR ("site backsurface-referenced ideal plane/range," or magnitude of the positive and negative deviation from a backside-referenced ideal plane for an individual component area of defined dimension) and corresponds to the GBIR or TTV of a component area ("site"). Therefore, in contrast to the global flatness GBIR, the SBIR is referenced to defined fields on the wafer, that is to say for example to segments of an area grid of measurement windows having a size of 26×8 mm$^2$ (site geometry). The maximum site geometry value SBIR$_{max}$ specifies the maximum SBIR value for the component areas taken into account on a silicon wafer.

According to the prior art, a silicon wafer can be produced by a process sequence that essentially comprises separating a single crystal of silicon into wafers, rounding the mechanically sensitive edges of the silicon wafers, and carrying out an abrasive step such as grinding or lapping, followed by polishing. The final flatness is generally produced by the polishing step, which may be preceded, if appropriate, by an etching step for removing disturbed crystal layers and for removing impurities.

In the case of polished silicon wafers, therefore, an attempt is made to achieve the required flatness by suitable processing steps such as grinding, lapping and polishing. However, the polishing of a silicon wafer usually gives rise to a decrease in the thickness of the planar silicon wafer toward the edge ("edge roll-off"). Etching methods also tend to attack the silicon wafer to be treated to a greater extent at the edge and to produce such an edge roll-off.

In order to counteract edge roll-off, it can be expedient for silicon wafers to be polished concavely or convexly. A concavely polished silicon wafer is thinner in the center and then increases in its thickness toward the edge. Silicon wafers polished in this way then have an undesired decrease in thickness only in their outermost edge region.

DE 19938340 C1 describes depositing a monocrystalline layer on monocrystalline silicon wafers, the layer consisting of silicon with the same crystal orientation, a so-called epitaxial layer. Such an epitaxial deposition step is usually preceded by stock removal polishing such as DSP (double-side polishing), final polishing such as CMP (chemomechanical polishing) and a cleaning step. DSP and CMP essentially differ in that a softer polishing cloth is used in CMP and normally only the front side of the silicon wafer is polished in a haze-free manner ("finishing").

DE 10025871 A1 discloses a method for producing a silicon wafer with an epitaxial layer deposited on its front side, this method comprising the following process steps:

(a) a stock removal polishing step as the sole polishing step;

(b) (hydrophilic) cleaning and drying of the silicon wafer;

(c) pretreatment of the front side of the silicon wafer at a temperature of 950 to 1250 degrees Celsius in an epitaxy reactor; and (d) deposition of an epitaxial layer on the front side of the pretreated silicon wafer.

It is customary, in order to protect silicon wafers from particle loading, to subject the silicon wafers to a hydrophilic cleaning after polishing. The hydrophilic cleaning produces native oxide on the front and rear sides of the silicon wafer which is very thin (approximately 0.5-2 nm, depending on the type of cleaning and measurement). This native oxide is removed in the course of a pretreatment in an epitaxy reactor under a hydrogen atmosphere (also called H$_2$ bake).

In a second step, the surface roughness of the front side of the silicon wafer is reduced and polishing defects are removed from the surface by usually small amounts of an etching medium, for example gaseous hydrogen chloride (HCl), being added to the hydrogen atmosphere.

Sometimes, besides an etching medium such as HCl, a silane compound, for example silane (SiH$_4$), dichlorosilane (SiH$_2$Cl$_2$), trichlorosilane (TCS, SiHCl$_3$) or tetrachlorosilane (SiCl$_4$), is also added to the hydrogen atmosphere in an amount such that silicon deposition and silicon etching removal are in equilibrium. Both reactions proceed at a sufficiently high reaction rate, however, so that silicon on the surface is mobile and the surface is smoothed and defects are removed on the surface.

Epitaxy reactors, which are used in particular in the semiconductor industry for the deposition of an epitaxial layer on a silicon wafer, are described in the prior art. During all coating or deposition steps, one or more silicon wafers are heated by means of heating sources, preferably by means of upper and lower heating sources, for example lamps or lamp banks, and subsequently exposed to a gas mixture, comprising a source gas, a carrier gas and, if appropriate, a doping gas.

A susceptor, which comprises graphite, SiC or quartz, for example, serves as a support for the silicon wafer in a process chamber of the epitaxy reactor. During the deposition process, the silicon wafer rests on this susceptor or in milled-out portions of the susceptor in order to ensure uniform heating and to protect the rear side of the silicon wafer, on which usually there is no layer deposition, from the source gas.

The process chambers of the epitaxy reactor are designed for one or more silicon wafers. In the case of silicon wafers having relatively large diameters, in particular in the case of silicon wafers having a diameter of 300 mm or 450 mm, single wafer reactors are usually used, wherein the silicon wafers are processed individually especially since this usually results in a uniform epitaxial layer thickness. The uniformity of the layer thickness can be improved in this case by adapting the process conditions, for example by optimizing the gas flows ($H_2$, $SiHCl_3$), by incorporating and adjusting gas inlet devices (injectors), by changing the deposition temperature or else by modifications to the susceptor.

In epitaxy it is furthermore customary, after one or more epitaxial depositions on silicon wafers, to carry out an etching treatment of the susceptor without a substrate, in the course of which the susceptor and also other parts of the process chamber are freed of silicon deposits.

The production of epitaxially coated silicon wafers with good global flatness proves to be extremely difficult since, as mentioned above, a concavely or convexly polished silicon wafer is usually present as the substrate. In the prior art, after the epitaxy, the global flatness and also the local flatness of the epitaxially coated silicon wafer have usually deteriorated compared with those of the polished silicon wafer. This is associated, inter alia, with the fact that the deposited epitaxial layer itself also has a certain, albeit small, thickness irregularity despite all optimization measures.

The deposition of an epitaxial layer of varying thickness (e.g. higher deposition in the center and less deposition at the edge of the wafer) in order to compensate for the non-uniform form of the polished silicon wafer and in this way also to improve the global flatness of the silicon wafer is not considered in the epitaxy of silicon wafers, since the thickness regularity of the epitaxial layer has to vary within defined limits in order to satisfy customer requirements.

DE 102005045339 B4 discloses a method for producing epitaxially coated silicon wafers, in which a multiplicity of silicon wafers which are polished at least on their front sides are provided and are successively coated individually in each case in an epitaxy reactor by a procedure in which a respective one of the silicon wafers provided is placed on a susceptor in the epitaxy reactor, is pretreated under a hydrogen atmosphere at a first hydrogen flow rate of 20-100 slm in a first step and with addition of an etching medium to the hydrogen atmosphere at a second, reduced hydrogen flow rate of 0.5-10 slm in a second step, is subsequently coated epitaxially on its polished front side and is removed from the epitaxy reactor, and an etching treatment of the susceptor is furthermore effected in each case after a specific number of epitaxial coatings.

DE 102005045339 B4 likewise discloses a silicon wafer having a front side and a rear side, wherein at least its front side is polished and an epitaxial layer is applied at least on its front side, and which has a global flatness value GBIR of 0.07-0.3 µm, relative to an edge exclusion of 2 mm. The comparatively good geometry of this epitaxially coated silicon wafer results from the fact that the reduction of the hydrogen flow rate in the second step of the pretreatment with addition of an etching medium makes it possible to etch away material at the edge of the silicon wafer in a targeted manner and to globally level the silicon wafer actually before the epitaxial-coating step. Disadvantages of the method are that although the reduced hydrogen flow rate intensifies the etching effect at the edge of the polished wafer, the gas flow over the semiconductor wafer is not laminar. This obviates further optimization of the global flatness below the best possible GBIR value of 0.07 µm claimed in DE 102005045339 B4.

US 2008/0182397 A1 discloses an epitaxy reactor which provides different gas flows in a so-called "inner zone" and a so-called "outer zone". For a wafer having a diameter of 300 mm, the "inner zone" is specified as a central region of the 300 mm wafer having a diameter of 75 mm. The setting of the different gas flows in the reactor is effected by setting the diameter of the gas pipes; thus, e.g. reducing the pipe diameter also reduces the gas flow in the direction of one of the two zones. Such gas distribution systems are commercially available from Applied Materials Inc. under the name Epi Centura Accusett™ (Epi Centura is the name of the epitaxy reactor from Applied Materials Inc.). As an alternative, for controlling the gas flows it is also possible to use so-called "Mass Flow Controllers" or similar devices for regulating the flow. The gas distribution in inner and outer zones is designated by I/O in US 2008/0182397 A1. This notation will also be used in the context of the present invention.

US 2008/0182397 A1 specifies two ranges for gas distribution I/O: firstly a range of I/O=0.2-1.0 during the epitaxial coating and secondly an I/O of 1.0-6.0 during the etching step (substrate pretreatment).

US 2008/0245767 A1 discloses a method in which a contaminated or damaged layer of a substrate is removed by means of an etching gas in order to uncover a substrate surface. This cleaned substrate can subsequently be epitaxially coated. The flow rate of the etching gas is 0.01-15 slm. If an inert gas (inert with respect to the substrate material, e.g. silicon) in particular, hydrogen, or else nitrogen, argon, helium or the like is supplied, the flow rate thereof is 1-100 slm. The temperature of the substrate is 600-850° C. 1.0-7.0 (5/5-35/5) is specified as the I/O ratio of the hydrogen flow.

US 2007/0010033 A1 discloses influencing the thickness of an epitaxially deposited layer by regulating the gas distribution in an inner and an outer zone. As mentioned above, however, the deposition of a thicker epitaxial layer in the center of the concavely polished silicon wafer, in order to compensate for the initial geometry of the polished wafer, is unsuitable since the specification of the layer thickness regularity of the epitaxial layer would thereby be exceeded.

The prior art indicates various solution routes for obtaining an improvement in the geometry of the substrate and/or the epitaxially coated silicon wafer by means of a corresponding choice of the processing conditions during the pretreatment steps and during the epitaxial coating.

However, the proposed methods, as described above, are associated with other disadvantages and for example are not suitable at all for improving a likewise frequently encountered geometry of the substrate to be epitaxially coated, namely the so-called "sombrero" form, in this way. The "sombrero" form is distinguished by the fact that the thickness is increased both at the edge and in the center of the wafer. If the total thickness of the substrate is plotted against the diameter, the thickness profile is similar to the form of a sombrero.

SUMMARY OF THE INVENTION

An object of the invention was to offer a solution to the problems encountered by the prior art, including sombrero wafers, and to avoid the disadvantages of the prior art as well. These and other objects are achieved by means of a first method for producing an epitaxially coated silicon wafer, in which a silicon wafer that has been polished on its front side is placed on a susceptor in the epitaxy reactor, is pretreated in a first step under a hydrogen atmosphere and in a second and a third step with addition of an etching medium to the hydrogen atmosphere, and is subsequently provided with an epitaxial layer, wherein during the first step and during the second step the hydrogen flow rate is 20-100 slm, during the second and third steps the flow rate of the etching medium is 0.5-1.5 slm, during the second step furthermore an average temperature in the reactor chamber is 950-1050° C. and the power of heating elements arranged above and below the susceptor is regulated in such a way that there is a temperature difference of 5-30° C. between a radially symmetrical region encompassing the central axis of the silicon wafer to be epitaxially coated and a part of the silicon wafer that lies outside said region; and during the third step the hydrogen flow rate is reduced to 0.5-10 slm. The objects are also achieved by means of a second method for producing an epitaxially coated silicon wafer, in which a silicon wafer that has been polished on its front side is placed on a susceptor in the epitaxy reactor, is pretreated in a first step under a hydrogen atmosphere and in a second and a third step with addition of an etching medium to the hydrogen atmosphere, and is subsequently provided with an epitaxial layer, wherein during all the pretreatment steps the hydrogen flow rate is 1-100 slm, during the second step the flow rate of the etching medium is 0.5-1.5 slm and during the third step the flow rate of the etching medium is 1.5-5 slm, during the second step an average temperature in the reactor chamber is 950-1050° C. and the power of heating elements arranged above and below the susceptor is regulated in such a way that there is a temperature difference of 5-30° C. between a radially symmetrical region encompassing the central axis of the silicon wafer to be epitaxially coated and a part of the silicon wafer that lies outside said region.

DETAILED DESCRIPTION OF THE PREFERRED EMBODIMENT(S)

Figure 1:
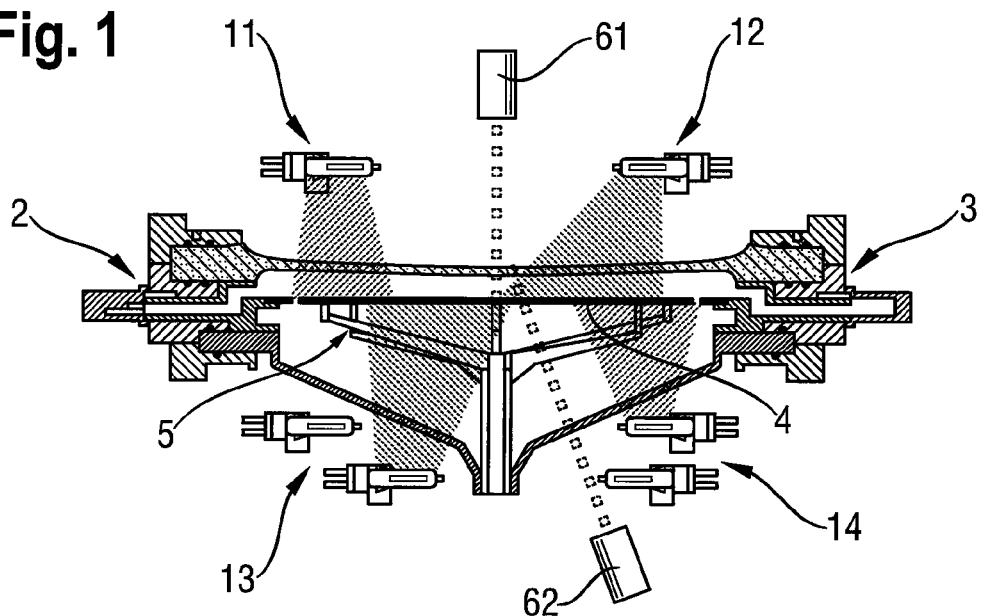
FIG. 1 shows the schematic construction of a reactor chamber of an epitaxy reactor for carrying out one embodiment of the invention.

Preferably, in the second method, gas flows introduced into the reactor chamber by means of injectors are distributed by means of valves into an outer and an inner zone of the reactor chamber, such that the gas flow in the inner zone acts on a region around the center of the silicon wafer and the gas flow in the outer zone acts on an edge region of the silicon wafer, and in the third pretreatment step the distribution of the etching medium in inner and outer zones is I/O=0-0.75.

The invention makes use of the fact, inter alia, that the removal rates during treatment of the silicon wafer with hydrogen and/or hydrogen+etching medium are temperature-dependent.

The radially symmetrical region encompassing the central axis of the silicon wafer is preferably a region having an extent of 1-150 mm, if the diameter of the silicon wafer is 300 mm. By way of example, a circular region having a diameter of 1-150 mm can be involved, the midpoint of which corresponds to the center of the silicon wafer.

It is essential to the invention and common to both methods of the invention that the temperature in an inner zone around the center of silicon wafer and susceptor (heating is effected from above and from below) is higher (or lower) than that in an outer zone (edge region). On account of the temperature dependence of the removal rate, this has the consequence that the material removal is higher either in the inner zone or in the edge region. Thus, the convex or concave initial geometry of the polished wafer can be counteracted, the global geometry (TTV, GBIR) can be improved and, finally, an epitaxially coated silicon wafer having good geometry properties can be provided.

The method according to the invention shows that the temperature range of 950-1050° C. is essential for this. Therefore, the second pretreatment step in both methods of the invention must be effected within this temperature range.

The epitaxy reactor described in EP 0 445 596 B1, for example, is suitable for carrying out the method. It comprises a reactor chamber, determined by a reactor vessel having a first dome and a second dome lying opposite, which are mechanically coupled, a holding device for holding a silicon wafer; a heating device for heating the semiconductor wafer, wherein the heating device comprises: a first heating source, which is situated outside the chamber and is arranged in such a way that energy is radiated through the first dome to the silicon wafer; and a second heating source, which is likewise situated outside the chamber and is arranged in such a way that energy is radiated through the second dome to the silicon wafer; and also a gas inlet and outlet apparatus for introducing gases into the chamber and for evacuating gases from said chamber.

The heating of silicon wafer and susceptor is therefore usually effected by heating elements arranged above and below the susceptor. IR lamps are involved in this case when using conventional epitaxy reactors such as the Epi Centura from Applied Materials, cf. EP 0 445 596 B1. The lamps can be arranged in a circular fashion, for example. However, other types of heating elements are also conceivable.

In addition, it is possible to regulate the power of the heating elements separately from one another. In the case of the IR lamp banks, it is possible to direct the thermal power in a targeted manner onto an inner region of the reactor chamber and separately therefrom onto an outer region of the reactor chamber.

The temperature difference between inner zone and outer zone which is essential to the invention can be realized through a suitable choice of the power of the heating elements which influence the temperature in the inner and outer regions.

The temperature difference between regions of the silicon wafer and the choice of an average temperature of 950-1050° C. in the second pretreatment step in both methods according to the invention are therefore essential to the invention.

In the methods according to the invention, firstly a multiplicity of silicon wafers which are polished at least on their front side are provided. For this purpose, a silicon single crystal produced according to the prior art, preferably by crucible pulling according to Czochralski, is sawn into a multiplicity of silicon wafers by means of known separation methods, preferably by wire sawing with free ("slurry") or bonded grain (diamond wire).

Furthermore, mechanical processing steps are effected, such as sequential single-side grinding methods (SSG), simultaneous double-side grinding methods ("double-disk grinding", DDG) or lapping. The edge of the silicon wafer including optionally present mechanical markings such as an orientation notch or an essentially rectilinear flattening of the silicon wafer edge ("flat") are generally processed as well (edge rounding, "edge-notch grinding"). In addition, chemical treatment steps comprising cleaning and etching steps are usually provided.

After the grinding, cleaning and etching steps, the surface of the silicon wafers is smoothed by stock removal polishing. In the case of single-side polishing (SSP), silicon wafers are held during processing on the rear side on a carrier plate by means of cement, by vacuum or by means of adhesion. In the case of double-side polishing (DSP), silicon wafers are inserted loosely into a thin toothed disk and polished on the front and rear side simultaneously in a manner "floating freely" between an upper and a lower polishing plate covered with a polishing cloth.

The front sides of the silicon wafers are then preferably polished in a haze-free manner, for example using a soft polishing cloth with the aid of an alkaline polishing sol. In order to obtain the flatness of the silicon wafers produced up to this step, the material removals are relatively small, preferably 0.05 to 1.5 μm. This step is often referred to as CMP polishing (chemomechanical polishing) in the literature.

After polishing, the silicon wafers are subjected to a hydrophilic cleaning and drying according to the prior art. The cleaning may be performed either as a batch method with simultaneous cleaning of a multiplicity of silicon wafers in baths, or by spraying methods or else as a single wafer process (single wafer cleaning).

The polished silicon wafers provided are subsequently pretreated individually in an epitaxy reactor. The pretreatment comprises a treatment of the silicon wafer in a hydrogen atmosphere ($H_2$ bake) and two treatments of the silicon wafer with addition of an etching medium to the hydrogen atmosphere. The etching medium is preferably hydrogen chloride (HCl).

The pretreatment in a hydrogen atmosphere and the two pretreatment steps with addition of an etching medium to the hydrogen atmosphere are effected, in the second method of the invention, at a hydrogen flow rate of 1-100 slm (standard liter per minute), preferably 20-60 slm and most preferably 20-40 slm. In the first method of the invention, the hydrogen flow rate is 20-100 slm in the first and second steps of the pretreatment and is reduced to 0.5-10 slm, preferably to 0.5-5 slm, in the third step. The duration of the pretreatment in a hydrogen atmosphere is preferably 10-120 s, more preferably 20-60 s.

During the second pretreatment step of both methods of the invention (hydrogen+etching medium), the flow rate of the etching medium is 0.5-1.5 slm. The second pretreatment with the etching medium takes place at a temperature of 950 to 1050° C. In this case, the power of the heating elements arranged above and below the susceptor is regulated in such a way that a radially symmetrical region encompassing the central axis of the silicon wafer to be epitaxially coated and having a diameter, for example, of 1-20 mm, 1-50 mm, 1-100 mm, 1-150 mm, or 1-200 mm has a temperature increased by 5-30° C. relative to that part of the silicon wafer which lies outside the region.

A treatment duration of 10-120 s is preferred during the HCl etching treatment, depending on the desired material removal at the edge of the silicon wafer to be epitaxially coated. A treatment duration of 20-60 s is particularly preferred.

The particular advantage of this method is that after the pretreatment steps the silicon wafer obtains an optimum form of the front side for the subsequent deposition of an epitaxial silicon layer since the convex form in a region around the center of the silicon wafer is compensated for by the pretreatment of the silicon wafer.

In the method of the invention, the inner zone therefore corresponds e.g. to a circle preferably having a diameter of 1-150 mm around the center of the silicon wafer, while the outer zone corresponds to a ring having a width of 1-150 mm which encompasses the edge of the silicon wafer. These values correspond to the application of the invention to silicon wafers having a diameter of 300 mm. With the use of silicon wafers of the next generation having a substrate diameter of 450 mm, inner and outer zones are preferably chosen to be correspondingly larger, and likewise correspondingly smaller in the case of smaller substrates such as 200 mm or 150 mm wafers.

The invention makes it possible to choose inner and outer zones depending on the initial geometry of the silicon wafer to be epitaxially coated and, consequently, to define exactly where material is precisely intended to be removed. Preferably, therefore, firstly the initial geometry of the polished wafer is determined in a batch of silicon wafers to be epitaxially coated and then the corresponding process settings for the pretreatment steps in the epitaxy reactor are chosen, that is to say in particular the extent of the inner zone, the lamp power and the temperature difference between inner and outer zones during the etching treatment in the reactor.

After the second pretreatment step, which influences the inner region of the silicon wafer, a third pretreatment step is effected, which is suitable, in particular, for improving the geometry in the edge region, which is concave in the case of silicon wafers having a "sombrero" thickness profile, and in combination with the second pretreatment step leads to a global leveling of the silicon wafer.

The invention provides three possibilities for the choice of the third pretreatment step, which is likewise effected in a hydrogen atmosphere with an addition of an etching medium.

In the first method, during the third pretreatment step the hydrogen flow rate is reduced with respect to the two preceding pretreatments to 0.5-10 slm, while the flow rate of the etching medium is not altered, that is to say is 0.5-1.5 slm.

In the second method, by contrast, the flow rate of the etching medium is increased to 1.5-5 slm, preferably to 2.0-4.5 slm, and most preferably to 3.0-4.0 slm, while the hydrogen flow rate can be kept constant. In one embodiment of this method, alongside the increased flow rate of the etching medium, it is also ensured that the etching medium passes into a defined region of the edge region of the silicon wafer in order to remove material in a targeted manner there and to improve the convex edge geometry.

Preferably, the third pretreatment step is effected in a temperature range of 950 to 1200° C., more preferably at 1050-1150° C. These temperature ranges are also particularly preferred during the first pretreatment step under a hydrogen atmosphere (without addition of an etching medium).

By virtue of the fact that the HCl flow rate in step 3 of the second method is increased to 1.5 5 slm, but the hydrogen flow rate can be kept constant, the thickness of the silicon wafer is reduced to a greater extent at the edge than in the direction of a center of the silicon wafer. This counteracts the concave geometry of the silicon wafer in its edge region.

While at an $H_2$ flow rate of 50 slm (standard liter per minute) and an HCl flow rate of e.g. 1 slm no increased material removal is observed at the edge of the silicon wafer (rather, the material removal is essentially uniform over the entire wafer), a material removal of up to 500-700 nm at the edge of the silicon wafer occurs as a result of an increase in the HCl flow rate to 1.5-5 slm, that is to say with a significantly increased HCl concentration, depending on the duration of the treatment with HCl.

The particular advantage of both methods of the invention is that after the pretreatment steps the silicon wafer obtains an optimum form of the front side for the subsequent deposition of an epitaxial silicon layer since the silicon wafer is leveled in its edge region and the concave form of the silicon wafer in the edge region is compensated for by the third pretreatment. In combination with the second pretreatment, it is thus also possible for the sombrero thickness profiles to be leveled.

It is particularly advantageous that a laminar gas flow prevails as a result of the $H_2$ flow rate that is preferably kept constant, in contrast to the first method of the invention, during the third pretreatment step of the second method of the invention.

As mentioned above, in one preferred embodiment of the second inventive method, during the third pretreatment step, the distribution of the HCl flow in the reactor chamber is controlled. This increases the selectivity of the etching treatment and is therefore especially preferred.

For the Epi Centura reactors from Applied Materials, an apparatus called Accusett™ is available, comprising valves ("metering valves"), which enables this distribution of the HCl flow. The flow of the etching medium is distributed into an inner and an outer zone of the reactor chamber. The control is preferably effected by means of suitable software.

The etching medium distributed into the inner zone acts on a region around the center of the silicon wafer situated on a susceptor. That part of the etching medium which is distributed into the outer zone of the chamber acts on an outer region of the silicon wafer, that is to say, in particular, on the edge region. Overall, inner and outer zones altogether correspond approximately to the size of the silicon wafer to be treated.

The distribution of the etching medium between inner and outer zones is 0 to at most 0.75. This ratio results from the quantity of etching medium in the inner zone with respect to the quantity of etching medium in the outer zone.

I/O=0 means, therefore, that the entire etching medium is essentially distributed into the outer zone, that is to say to the edge region of the silicon wafer. I/O=0.75 correspondingly means that three parts are conducted into the inner zone and four parts into the outer zone, which can lead to a material removal higher by approximately ⅓ in the edge region.

With regard to the I/O distribution claimed, a significant difference is manifested with respect to the prior art, which prescribes a distribution of 1.0 up to 6.0 during the etching treatment as in US 2008/0182397 A1.

The size of the inner and outer zones relative to the silicon wafer can likewise be controlled, most simply by corresponding arrangement and configuration of the gas inlet apparatuses ("injectors") that conduct the gases into the reactor chamber. By way of example, the inner zone could be a circular region having a diameter of 75 mm in the center of the silicon wafer, given a wafer diameter of 300 mm, as already described in US 2008/0182397 A1.

In the method according to the invention, the inner zone preferably corresponds to a circle having a diameter of 1-20 mm, 1-50 mm, 1-75 mm, 1-100 mm, 1-150 mm or greater around the center of the silicon wafer, while the outer zone corresponds to a ring having a width of 1-20 mm, 1-50 mm, 1-75 mm, 1-100 mm, 1-150 mm or greater which encompasses the edge of the silicon wafer in each case. These values are likewise based on silicon wafers having a diameter of 300 mm. With the use of silicon wafers of the next generation currently in development and having a substrate diameter of 450 mm, inner and outer zones, analogously thereto, are preferably chosen to be somewhat larger (e.g. up to 1-200 mm or 1-250 mm).

The quantity of the etching medium in the inner and outer zones is preferably realized by altering the diameter of the gas pipelines for the inner and outer zones. The quantity of the etching medium is respectively reduced by reducing the line diameter.

In principle, the following setup is preferred in this embodiment of the second method according to the invention: the gas quantity is set by means of a Mass Flow Controller (MFC) that is able to set a flow rate of between 0.5 and 5 slm. This gas quantity is then passed via a main gas line to two needle valves (inner and outer zones) and distributed there. The regulation is effected by setting the valves (regulation of the line diameter for inner and outer zones independently of one another). The distributed gas quantities are then introduced into the reactor chamber by means of an injector. This setup has the advantage that automatic control by means of suitable software is possible.

After the pretreatment steps, an epitaxial layer is deposited at least on the polished front side of the silicon wafer. For this purpose, a silane source as source gas is added to hydrogen as carrier gas. The epitaxial layer is deposited at a temperature of 900-1200° C. depending on the silane source used. Trichlorosilane (TCS) is preferably used as the silane source, most preferably at a deposition temperature of 1050-1150° C. The thickness of the deposited epitaxial layer is usually 0.5-5 µm. After the deposition of the epitaxial layer, the epitaxially coated silicon wafer is removed from the epitaxy reactor. After a specific number of epitaxial depositions on silicon wafers, the susceptor is usually treated with an etching medium, preferably with HCl, in order to free the susceptor of silicon deposits, by way of example. A susceptor etching is preferably effected after 1-15 epitaxial coatings of silicon wafers. For this purpose, the epitaxially coated silicon wafer is removed and the substrate-free susceptor is treated with HCl. Preferably, besides the susceptor surface, the entire process chamber is flushed with hydrogen chloride in order to remove silicon deposits.

The susceptor is preferably coated with silicon after the susceptor etching and before further epitaxial processes. This may be advantageous since the silicon wafer to be epitaxially coated does then not bear directly on the susceptor.

The silicon wafer is preferably a wafer made of monocrystalline silicon material, an SOI ("silicon-on-insulator") wafer, a silicon wafer with a strained silicon layer ("strained silicon") or an sSOI ("strained silicon-on-insulator") wafer which is provided with an epitaxial layer, or a silicon wafer which is provided with a silicon-germanium (SiGe) layer.

The invention is explained below on the basis of examples relating to an epitaxy reactor of the type Epi Centura from Applied Materials, and with reference to the figures.

FIG. 1 illustrates the schematic construction of a reactor chamber for carrying out the method according to the invention. Heating elements 11 (top, outer region), 12 (top, inner region), 13 (bottom, inner region) and 14 (bottom, outer region) are illustrated. The reactor comprises a susceptor 4 for receiving the silicon wafer to be epitaxially coated, a gas inlet apparatus 2, a gas outlet apparatus 3, an apparatus 5 for mounting and for lifting susceptor and substrate (e.g. by means of so-called lift pins), and pyrometers 61 and 62 for contactlessly measuring the temperature in the reactor chamber.

Table 1 now shows by way of example typical values for lamp powers in the case of the Epi Centura which can create the temperature difference essential to the invention between inner and outer zones.

In this case, the total lamp power is 70 kW, distributed among the four lamp banks illustrated in FIG. 1 (top/inside, top/outside, bottom/inside, bottom/outside). This corresponds to an average temperature in the chamber of approximately 950-1050° C. 60% of the total power comes from the upper lamp banks or heating elements. The distribution of the lamp power between inside/outside is chosen to be different during the etching pretreatment than during the epitaxial coating.

In the Epi Centura the distribution 54%/13% leads to a homogeneous temperature distribution between silicon wafer and susceptor. Here the temperature is substantially identical in all regions of the silicon wafer. In order to achieve a homogeneous temperature distribution, an optimum energy distribution has to be determined for each reactor chamber. This energy distribution can vary in different reactor chambers even of the same reactor type (e.g. Epi Centura). It poses no problems for a person skilled in the art to firstly set a homogeneous temperature distribution.

TABLE 1

| Total power | Upper heating elements | | Lower heating elements | |
|---|---|---|---|---|
| 70 kW | 25 kW = 60% of 70 kW | | 45 kW = 40% of 70 kW | |
| Distribution inside/ outside | Inside | Outside | Inside | Outside |
| Epitaxial coating | 13.5 kW = 54% of 25 kW | 11.5 kW | 5.85 kW = 13% of 45 kW | 39.15 kW |
| Etching pretreatment | 16.5 kW = 66% of 25 kW | 8.5 kW | 7.2 kW = 16% of 45 kW | 37.8 kW |

The following procedure is preferably adopted for determining the optimum energy distribution for the epitaxy step:

A group of p-wafers (e.g. five wafers) each having a substrate resistance>10 ohm cm is used. Different energy distributions are set for each wafer (e.g. wafer 1: 54%/13% . . . wafer 2: 58%/14%, etc). The five wafers are then measured for example using an SP1 light scattering measurement instrument from KLA Tencor and, if necessary, examined under a microscope. An average setting is chosen for the further epitaxy steps. The aim is to achieve an energy distribution that is as homogeneous as possible over the silicon wafer for the epitaxy step. This procedure is also referred to as "running a slip window" among experts in the field of semiconductor epitaxy.

In the course of production, wafers are regularly examined for possible slips. If there are slips on the wafers, the "slip window" is run in order once again to determine an optimum setting of the energy distribution.

In the present invention, preferably proceeding from an energy distribution optimized in such a manner for the epitaxy process, the power is increased in the inner zone for the etching pretreatment in order to obtain the required temperature difference between inner and outer zones.

If, for the epitaxy process, for example, an optimized value of 54% or 62% results for the power of the upper heating elements into the inner zone (for a homogeneous temperature distribution over the whole wafer), then a value of 66% or 72%, respectively, is preferred for the etching pretreatment.

During the etching pretreatment, therefore, the energy distribution proceeding from the previous optimization is always chosen differently in order to achieve the temperature difference essential to the invention of 5-30°.

The distribution 66%/16% from table 1 led to a temperature difference of approximately 20° C. Variations of this distribution make it possible to set the temperature difference in the entire range claimed.

Figure 2:
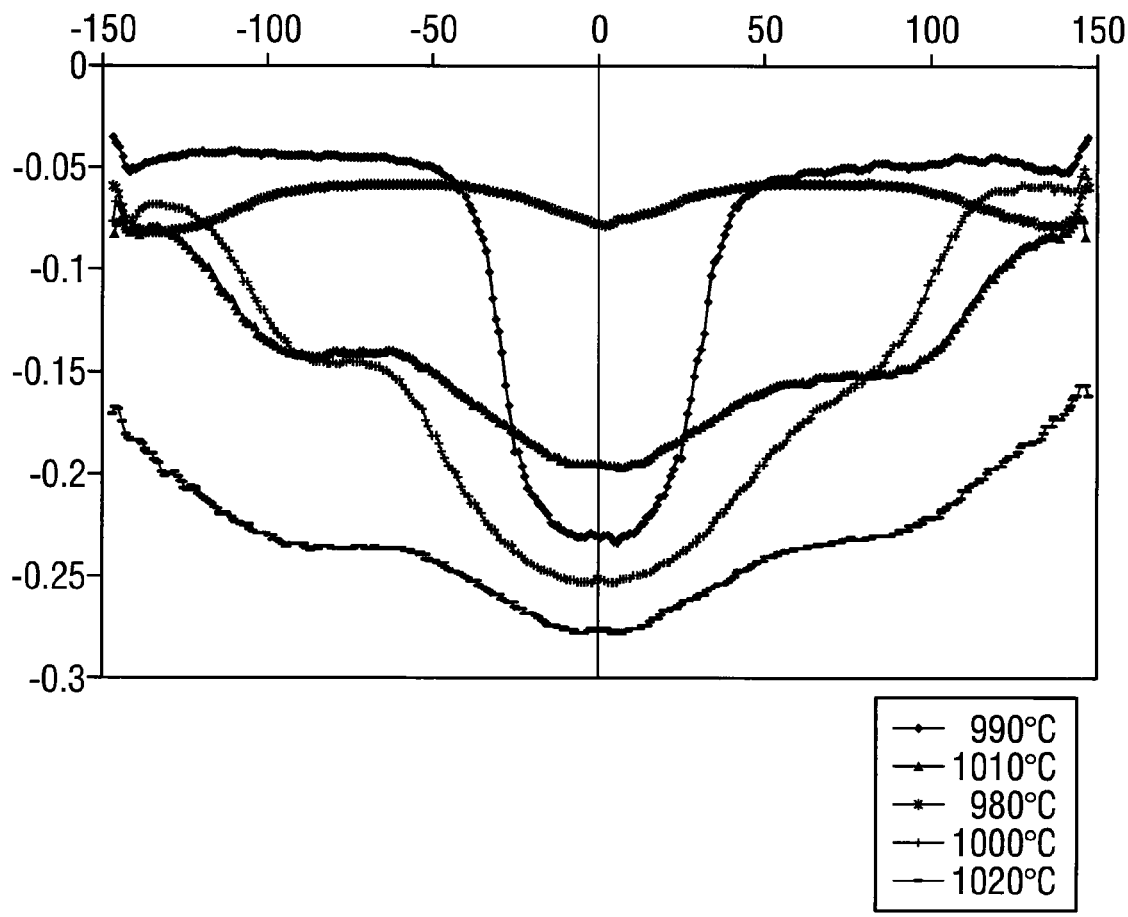
FIG. 2 shows the material removal at a polished silicon wafer having a diameter of 300 mm by etching pretreatment in an epitaxy reactor for various treatment temperatures. This corresponds to the respective second pretreatment steps of both methods of the invention.

FIG. 2 shows the material removal from silicon wafers having a diameter of 300 mm (therefore the inscription on the axis from −150 mm to +150 mm) as a function of the average temperature of the silicon wafer. The distribution 66%/16% from table 1 was used in the pretreatment steps. The temperature difference between inner and outer zones of the silicon wafer was approximately 20° C.

It is evident that the material removal in the inner region of the silicon wafer around the center thereof (x-axis=0) exhibits a significant temperature dependence. A temperature of 980° C. and 1000° C. and 1020° C. exhibits an etching removal profile that is particularly suitable for correcting the geometry for most convexly polished silicon wafers in a particularly advantageous manner. Therefore, this temperature range is especially preferred for the method of the invention.

Figure 3:
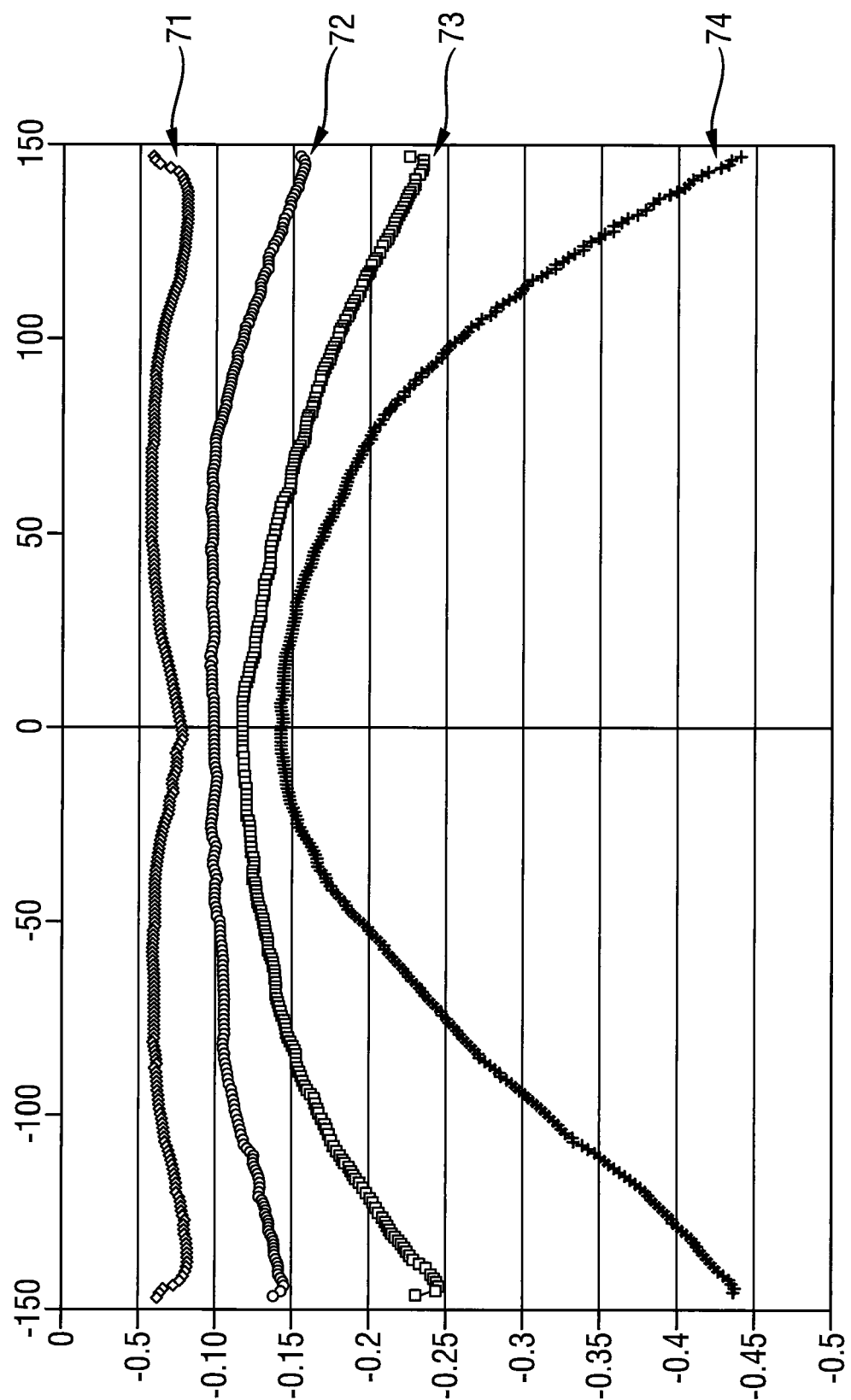
FIG. 3 show the material removal at a polished silicon wafer having a diameter of 300 mm by etching pretreatment in an epitaxy reactor for various flow rates of the etching medium and I/O ratios. The second method of the invention and its preferred embodiment are illustrated.

FIG. 3 shows the material removal at a polished silicon wafer in each case for various etching treatments. The illustration shows in each case the removal in μm as a function of the diameter of the silicon wafer in mm (represented as a line scan from −150 mm to +150 mm).

71 shows the material removal after etching treatment in the epitaxy reactor at a flow rate of the etching medium of 0.9 slm. This corresponds to a standard etch according to the prior art with HCl flow rate limited by the conventional mass flow controller (usually max. 1 slm).

72 shows the material removal at the silicon wafer after pretreatment with an HCl flow rate of 1.5 slm and a treatment duration of 30 sec (step 3 in the second method of the invention).

73 shows the material removal of the wafer after treatment of the invention with an HCl flow rate of 1.5 slm, a treatment duration of 40 sec and a gas distribution according to the invention of I/O=0/200.

74 shows the material removal of the wafer after treatment of the invention with an HCl flow rate of 2.5 slm, a treatment duration of 40 sec and a gas distribution according to the invention of I/O=0/200=0. 74, in particular, manifests a significant increase in the etching removal in the edge region.

Figure 4:
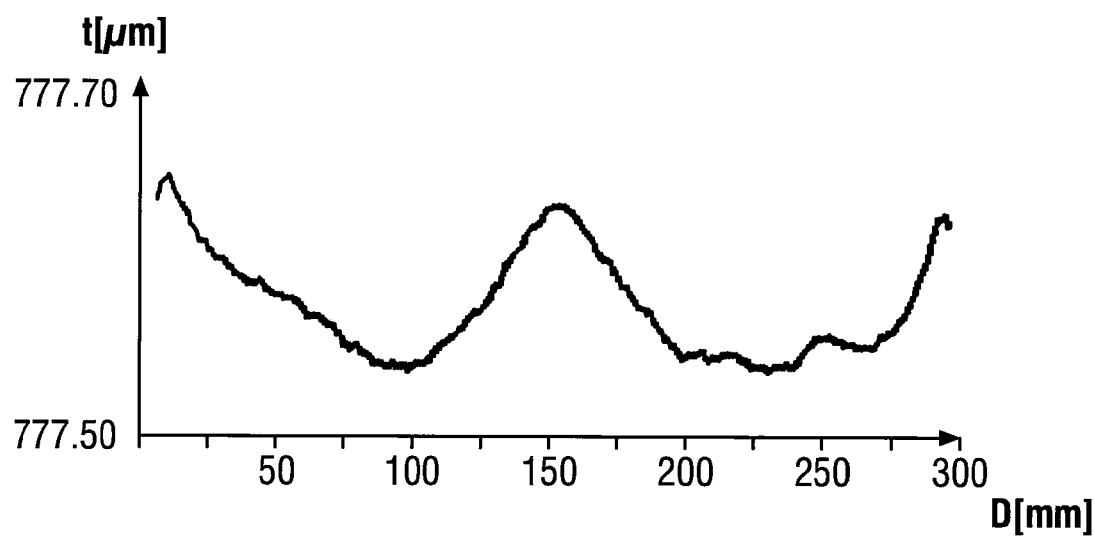
FIG. 4 and FIG. 5 show thickness profiles of polished silicon wafers without (FIG. 4) and after pretreatment according to the invention (FIG. 5) in the epitaxy reactor.
Figure 5:
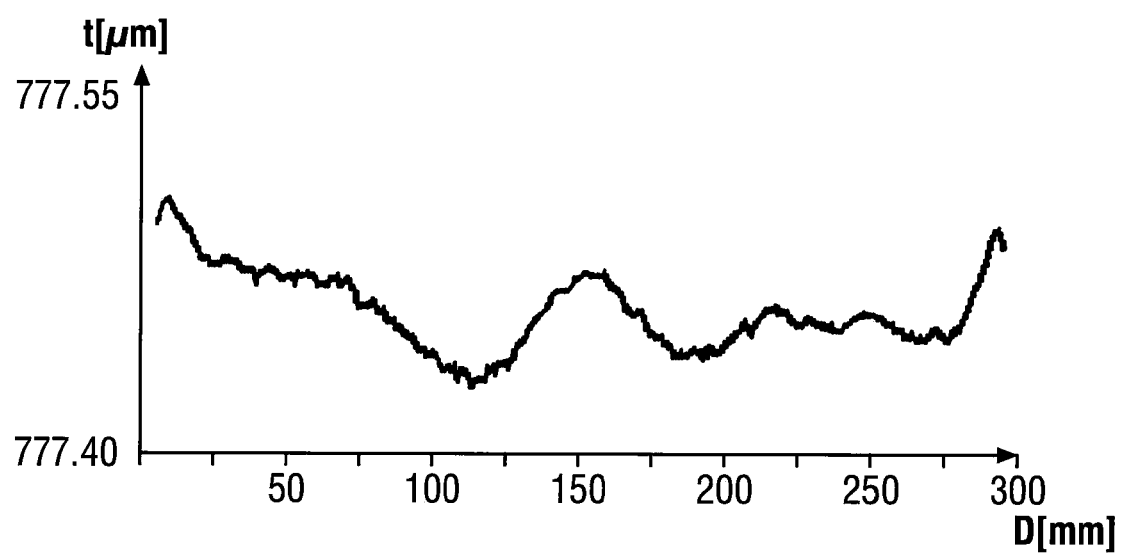

EXAMPLE:

An epitaxial layer was deposited on a silicon wafer having a diameter of 300 mm that had been produced in accordance with the prior art and finally polished by means of CMP on its front side. The silicon wafer to be epitaxially coated had a concave edge geometry and a convex geometry in a region around the center of the silicon wafer. FIG. 4 and FIG. 5 show corresponding total thickness profiles by way of example. The edge roll-off of the thickness can also be discerned.

In this case, FIG. 4 illustrates a polished silicon wafer without the pretreatment described, and FIG. 5 with pretreatment according to the invention. The process parameters used for this purpose are explained below. The profile of the total thickness as a function of the diameter (0 to 300 mm) is illustrated in each case.

During the pretreatment of this silicon wafer in the epitaxy reactor, firstly a pretreatment was effected in a hydrogen atmosphere at an $H_2$ flow rate of 60 slm for approximately 60 sec. This $H_2$ bake was effected at a temperature of 1150° C.

Afterward, the process was shifted to a temperature of 1000° C. (ramp) and HCl with a flow rate of 1.0 slm was added to the hydrogen atmosphere. The hydrogen flow rate was once again 60 slm in this step 2. In step 2, a temperature distribution leading to a temperature difference of 20° C. between inner and outer zones (temperature in the inner zone is 20° C. higher than the temperature in the outer zone), was chosen. The distribution 66%/16% with respect to the lamp power was utilized for this purpose, cf. table 1. An increased material removal in the region of the wafer center was obtained as a result.

During the subsequent pretreatment, which was once again effected with hydrogen chloride added to the hydrogen atmosphere, the HCl flow rate was 3.5 slm. The HCl flow rate was thus increased in step 3 by comparison with step 2. It would likewise be possible instead to reduce the $H_2$ flow rate to 10 slm or less (cf. first method according to the invention). In the example, the hydrogen flow rate in step 3 was 20 slm. By means of step 3, material was predominantly removed at the edge of the silicon wafer. Step 3 was effected after the process had been shifted to a temperature of 1150° C.

Finally, in step 4, an epitaxial layer was deposited at a deposition temperature of 1120° C., a hydrogen flow rate of 50 slm and a trichlorosilane (TCS) flow rate of 17 slm. The deposition temperature was 1120° C.

The most important process parameters are presented at a glance below:

|  | Step 1 $H_2$ bake | Step 2 Etching 1 | Step 3 Etching 2 | Step 4 Deposition |
|---|---|---|---|---|
| Distribution of etching medium I/O |  |  | 0/200 |  |
| Lamp power |  | 66%/16% |  |  |
| HCl in slm | 60 | 60 | 20 | 50 |
| TCS in slm |  |  |  | 17 |
| Temperature in ° C. | 1150 | 1000 | 1150 | 1120 |

It was thereby possible overall to compensate for the sombrero thickness profile from FIG. 4 and, after step 4, the epitaxial coating, to obtain an epitaxially coated silicon wafer having outstanding global flatness.

The process parameters in step 4 are chosen in such a way that an epitaxial layer which is as regular as possible with regard to its thickness is deposited.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A method for producing an epitaxially coated silicon wafer, comprising placing a silicon wafer polished on its front side on a susceptor in an epitaxy reactor, pretreating the silicon wafer in a first step under a hydrogen atmosphere and in a second and a third step with addition of an etching medium to the hydrogen atmosphere, and subsequently coating with an epitaxial layer, wherein during the first step and during the second step the hydrogen flow rate is 20-100 slm, during the second and third steps the flow rate of the etching medium is 0.5-1.5 slm, during the second step furthermore an average temperature in the reactor chamber is 950-1050° C. and the power of heating elements arranged above and below the susceptor is regulated in such a way that there is a temperature difference of 5-30° C. between a radially symmetrical region encompassing the central axis of the silicon wafer to be epitaxially coated and a part of the silicon wafer that lies outside the radially symmetrical region; and during the third step the hydrogen flow rate is reduced to 0.5-10 slm.

2. The method of claim 1, wherein step 1 and step 3 of the pretreatment are effected in a temperature range of 950 to 1200° C.

3. The method of claim 2, wherein step 1 and step 3 of the pretreatment are effected in a temperature range of 1050 to 1150° C.

4. The method of claim 1, wherein during step 1 and step 2 of the pretreatment, the hydrogen flow rate is 40-60 slm.

5. The method of claim 1, wherein the duration of the pretreatment is 10-120 s during each pretreatment step.

6. The method of claim 1, wherein the duration of the pretreatment is 20-60 s during each pretreatment step.

7. The method of claim 1, wherein during the third step of the pretreatment, the hydrogen flow rate is reduced to 0.5-5 slm.

8. The method of claim 1, wherein during the second step of the pretreatment, an average temperature in the reactor chamber is 980-1020° C.

9. A method for producing an epitaxially coated silicon wafer, comprising placing a silicon wafer polished on its front side on a susceptor in an epitaxy reactor, pretreating the silicon wafer in a first step under a hydrogen atmosphere and in a second and a third step with addition of an etching medium to the hydrogen atmosphere, and subsequently coating with an epitaxial layer, wherein during all the pretreatment steps the hydrogen flow rate is 1-100 slm, during the second step the flow rate of the etching medium is 0.5-1.5 slm and during the third step the flow rate of the etching medium is 1.5-5 slm, during the second step an average temperature in the reactor chamber is 950-1050° C. and the power of heating elements arranged above and below the susceptor is regulated in such a way that there is a temperature difference of 5-30° C. between a radially symmetrical region encompassing the central axis of the silicon wafer to be epitaxially coated and a part of the silicon wafer that lies outside the radially symmetrical region.

10. The method of claim 9, wherein gas flows introduced into the reactor chamber by means of injectors are distributed by means of valves into an outer and an inner zone of the reactor chamber, such that the gas flow in the inner zone acts on a region around the center of the silicon wafer and the gas flow in the outer zone acts on an edge region of the silicon wafer, and in the third pretreatment step the distribution of the etching medium in inner and outer zones is I/O=0-0.75.

11. The method of claim 9, wherein step 1 and step 3 of the pretreatment are effected in a temperature range of 950 to 1200° C.

12. The method of claim 11, wherein step 1 and step 3 of the pretreatment are effected in a temperature range of 1050 to 1150° C.

13. The method of claim 9, wherein during step 1 and step 2 of the pretreatment, the hydrogen flow rate is 20-80 slm.

14. The method of claim 13, wherein during step 1 and step 2 of the pretreatment, the hydrogen flow rate is 40-60 slm.

15. The method of claim 9, wherein the duration of the pretreatment is 10-120 s during each pretreatment step.

16. The method of claim 15, wherein the duration of the pretreatment is 20-60 s during each pretreatment step.

17. The method of claim 9, wherein the hydrogen flow rate in step 3 of the pretreatment is 20-60 slm.

18. The method of claim 17, wherein the hydrogen flow rate in step 3 of the pretreatment is 20-40 slm.

19. The method of claim 9, wherein in step 3 of the pretreatment, the flow rate of the etching medium is 2.0-4.5 slm.

20. The method of claim 9, wherein in step 3 of the pretreatment, the flow rate of the etching medium is 3.0-4.0 slm.

21. The method of claim 9, wherein during the second step of the pretreatment, an average temperature in the reactor chamber is 980-1020° C.

\* \* \* \* \*